(12) United States Patent
Peng et al.

(10) Patent No.: US 12,425,057 B2
(45) Date of Patent: Sep. 23, 2025

(54) SWITCHABLE TRANSMISSION LINE STRUCTURE FOR DIGITAL PRE-DISTORTION (DPD) IN MILLIMETER WAVE PHASED ARRAY ENVIRONMENT

(71) Applicant: MediaTek Inc., Hsin-Chu (TW)

(72) Inventors: Solti Peng, San Jose, CA (US); Jenwei Ko, San Jose, CA (US); Caiyi Wang, San Jose, CA (US)

(73) Assignee: MEDIATEK INC., Hsin-Chu (TW)

( * ) Notice: Subject to any disclaimer, the term of this patent is extended or adjusted under 35 U.S.C. 154(b) by 226 days.

(21) Appl. No.: 18/334,334

(22) Filed: Jun. 13, 2023

(65) Prior Publication Data

US 2024/0137054 A1 Apr. 25, 2024
US 2024/0235588 A9 Jul. 11, 2024

Related U.S. Application Data

(60) Provisional application No. 63/380,597, filed on Oct. 24, 2022.

(51) Int. Cl.
*H04B 1/04* (2006.01)
(52) U.S. Cl.
CPC ................ *H04B 1/0475* (2013.01)
(58) Field of Classification Search
CPC .... H04B 1/0475; H04B 1/0483; H03F 1/3247
See application file for complete search history.

(56) References Cited

U.S. PATENT DOCUMENTS

| | | | |
|---|---|---|---|
| 7,502,631 B2 | 3/2009 | Hashemi et al. | |
| 11,121,731 B2* | 9/2021 | Ravi | H03L 7/24 |
| 11,152,699 B2 | 10/2021 | Tervo et al. | |
| 2012/0050094 A1 | 3/2012 | Nakabayashi et al. | |
| 2017/0324161 A1 | 11/2017 | Kareisto et al. | |

(Continued)

OTHER PUBLICATIONS

Fager et al., Linearity and efficiency in 5G transmitters: New techniques for analyzing efficiency, linearity, and linearization in a 5G active antenna transmitter context. IEEE Microwave Magazine. Apr. 3, 2019;20(5):35-49.

(Continued)

*Primary Examiner* — David S Huang
(74) *Attorney, Agent, or Firm* — McClure, Qualey & Rodack, LLP

(57) ABSTRACT

Described herein are systems with switchable circuitry configured to selectively couple transmitter outputs to processing hardware, which may selectively route subsets of distortion measurements from transmitters for DPD processing that compensates for the measured distortion. The switchable nature of the distortion measurement propagation paths permits the paths to be made substantially shorter than static paths, resulting in improved (e.g., reduced and/or more uniform) attenuation and/or phase change across a transceiver array. In one example, measurement propagation paths may be no longer than a row or column of the array. In some embodiments, systems described herein may be suitable for implementation at mmW transmit and/or receive frequencies, where the length of measurement paths may have a significant impact on attenuation and phase changes.

16 Claims, 8 Drawing Sheets

(56) References Cited

U.S. PATENT DOCUMENTS

| | | |
|---|---|---|
| 2017/0356985 A1 | 12/2017 | Yoshino |
| 2018/0219711 A1* | 8/2018 | Laporte ................ H04B 7/0617 |
| 2019/0273541 A1* | 9/2019 | Ohshima ............. H04B 7/0697 |
| 2020/0348395 A1 | 11/2020 | Belot et al. |
| 2020/0412420 A1* | 12/2020 | Jakobsson ............ H04L 5/0037 |
| 2021/0305945 A1* | 9/2021 | Pratt .................... H04B 1/0475 |

OTHER PUBLICATIONS

Hesami et al., Single digital predistortion technique for phased array linearization. 2019 IEEE International Symposium on Circuits and Systems (ISCAS). May 26, 2019: 5 pages.

Ng et al., Digital predistortion of millimeter-wave RF beamforming arrays using low number of steering angle-dependent coefficient sets. IEEE Transactions on Microwave Theory and Techniques. Jul. 16, 2019;67(11):4479-92.

Tervo et al., Digital predistortion of amplitude varying phased array utilising over-the-air combining. 2017 IEEE MTT-S International Microwave Symposium (IMS) Jun. 4, 2017:1165-8.

Tervo et al., Digital predistortion of millimeter-wave phased array transmitter with over-the-air calibrated simplified conductive feedback architecture. 2020 IEEE/MTT-S International Microwave Symposium (IMS). Aug. 4, 2020:543-6.

Yu et al., Full-angle digital predistortion of 5G millimeter-wave massive MIMO transmitters. IEEE Transactions on Microwave Theory and Techniques. Jun. 19, 2019;67(7):2847-60.

\* cited by examiner

SWITCHABLE TRANSMISSION LINE STRUCTURE FOR DIGITAL PRE-DISTORTION (DPD) IN MILLIMETER WAVE PHASED ARRAY ENVIRONMENT

CROSS-REFERENCE TO RELATED APPLICATIONS

This application claims the benefit under 35 U.S.C. § 119(e) of U.S. Provisional Application No. 63/380,597, filed Oct. 24, 2022, and entitled "COUPLERS WITH CONFIGURABLE TRANSMISSION LINE STRUCTURE FOR PA MEASUREMENT IN MMW PHASE ARRAY ENVIRONMENT," which is hereby incorporated by reference herein in its entirety.

BACKGROUND

Phased array systems are antenna transmission and/or reception systems that typically include many antennas arranged in an array and connected to a transceiver system. A transceiver system transmits and/or receives signals via an array of antennas.

A transceiver system in a phased array system may include transmit and/or receive beamforming circuitry that applies appropriate phase shifts and/or time delays to transmitted signals prior to the signals reaching the antennas for transmission and/or signals received using the antennas. Phase shifts and/or time delays are used to steer the transmitted signals in a particular direction of focus, thereby forming a transmit beam in that direction, and/or to steer the direction of reception by the array in a particular direction of focus, thereby forming a receive beam in that direction.

Digital Pre-Distortion (DPD) processing is used in antenna systems to compensate for non-linearity in the gain and/or phase of the system's transmitter(s). It is desirable for transmitters to apply substantially the same amount of amplification to each signal that is to be transmitted over a range of initial signal power levels, resulting in linear amplifier gain over that range. In DPD, a measurement of a transmitter's output may be obtained and provided to a processor to create a non-linearity profile for the transmitter. Using the non-linearity profile, signals to be transmitted by the transmitter may be appropriately pre-distorted (e.g., their power levels adjusted to be higher or lower and/or phases adjusted) to compensate for non-linearity in the transmitter.

BRIEF SUMMARY

Some embodiments relate to a transceiver system comprising a plurality of transmitters configured to operate in at least one frequency band in a range from 10 GHz to 300 GHz, each transmitter comprising circuitry configured to obtain a distortion measurement of the transmitter, and a switch network controllable to selectively couple at least one of the distortion measurements of the plurality of transmitters to a processor.

In some embodiments, the switch network may be controllable between, at least a first state, in which the switch network is configured to couple the circuitry of a first transmitter of the plurality of transmitters to the processor and to decouple the circuitry of a second transmitter of the plurality of transmitters from the processor and a second state, in which the switch network is configured to couple the circuitry of the second transmitter to the processor and to decouple the circuitry of the first transmitter from the processor.

In some embodiments, in the first state, the switch network may be further configured to couple a first group of transmitters of the plurality of transmitters, including the first transmitter and a third transmitter, to the processor and to decouple a second group of transmitters of the plurality of transmitters, including the second transmitter and a fourth transmitter, from the processor, and, in the second state, the switch network may be further configured to couple the second group of transmitters to the receive beamformer and to decouple the first group of transmitters from the processor.

In some embodiments, the plurality of transmitters may be configured to operate in at least one frequency band within a range from 24 GHz to 71 GHz.

In some embodiments, the transceiver system may further comprise the processor, and the processor may be a baseband processor configured to use the at least one of the distortion measurements to perform digital pre-distortion (DPD) processing on signals to be transmitted via the plurality of transmitters, the switch network may be coupled to the processor.

In some embodiments, the circuitry of each of the plurality of transmitters may comprise a directional coupler having an input coupled to an output of the transmitter and an output coupled to the switch network.

In some embodiments, a phased array system may comprise the transceiver system and a plurality of antennas coupled to the plurality of transmitters, respectively, and configured to transmit and/or receive signals in the at least one frequency band.

In some embodiments, the phased array system may further comprise a receive beamformer comprising a summing circuit and a demodulator configured to receive signals via the plurality of antennas, and the switch network may be configured to provide distortion measurements of the plurality of transmitters to processor via the summing circuit and/or the demodulator.

In some embodiments, each transmitter of the plurality of transmitters may comprise an amplifier and the circuitry is configured to obtain the distortion measurement from an output of the amplifier.

Some embodiments relate to a transceiver system comprising a plurality of transceivers arranged in a plurality of groups of at least one transceiver, each transceiver comprising a transmit amplifier and a coupler coupled to an output of the transmit amplifier, and a plurality of switches, each switch configured to be coupled between a processor and at least one coupler of a respective group of at least one transceiver of the plurality of groups of at least one transceiver.

In some embodiments, the couplers may be configured to obtain distortion measurements from the outputs of the transmit amplifiers, respectively, and the plurality of switches may be configured to provide the distortion measurements to the processor.

In some embodiments, the transceiver system may further comprise the processor, and the processor may be a baseband processor configured to use the distortion measurements to perform digital pre-distortion (DPD) processing on signals to be transmitted via the plurality of transceivers, and each switch may be coupled between the processor and the at least one coupler of the respective group of at least one transceiver of the plurality of groups of at least one transceiver.

In some embodiments, the plurality of switches may comprises a first switch configured to be coupled between the processor and a first coupler of a first group of at least one transceiver of the plurality of groups of at least one transceiver, and a second switch configured to be coupled between the processor and a second coupler of a second group of at least one transceiver of the plurality of groups of at least one transceiver.

In some embodiments, a phased array system may comprise the transceiver system and an antenna array arranged in a first dimension and a second dimension, the antenna array comprising a first group of antennas disposed along the first dimension and a second group of antennas disposed along the first dimension and spaced from the first group of antennas in the second dimension, and the first group of at least one transceiver may comprise a first plurality of transceivers respectively coupled to the first group of antennas, and the second group of at least one transceiver may comprise a second plurality of transceivers respectively coupled to the second group of antennas.

In some embodiments, the first switch may be configured to be coupled between each coupler of the first plurality of transceivers and the processor, and the second switch may be configured to be coupled between each coupler of the second plurality of transceivers and the processor.

In some embodiments, the plurality of switches may comprise a third switch coupled between the first switch and the second switch.

In some embodiments, the couplers may be directional couplers, each directional coupler having an input coupled to an output of a respective transmit amplifier of the plurality of transceivers and an output coupled to the plurality of switches.

In some embodiments, the plurality of transceivers may be configured to operate in at least one frequency band within a range from 24 GHz to 71 GHz.

In some embodiments, the transceiver system may further comprise a plurality of antennas coupled to the plurality of transceivers and configured to transmit and/or receive signals.

In some embodiments, the transceiver system may further comprise receive beamforming circuitry comprising summing circuitry configured to sum signals received via the plurality of antennas and demodulation circuitry configured to down-convert a frequency of signals received via the plurality of antennas, the plurality of switches coupled between the summing circuitry and the respective couplers and/or between the demodulation circuitry and the respective couplers.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the systems and devices described herein.

DETAILED DESCRIPTION

Figure 1:
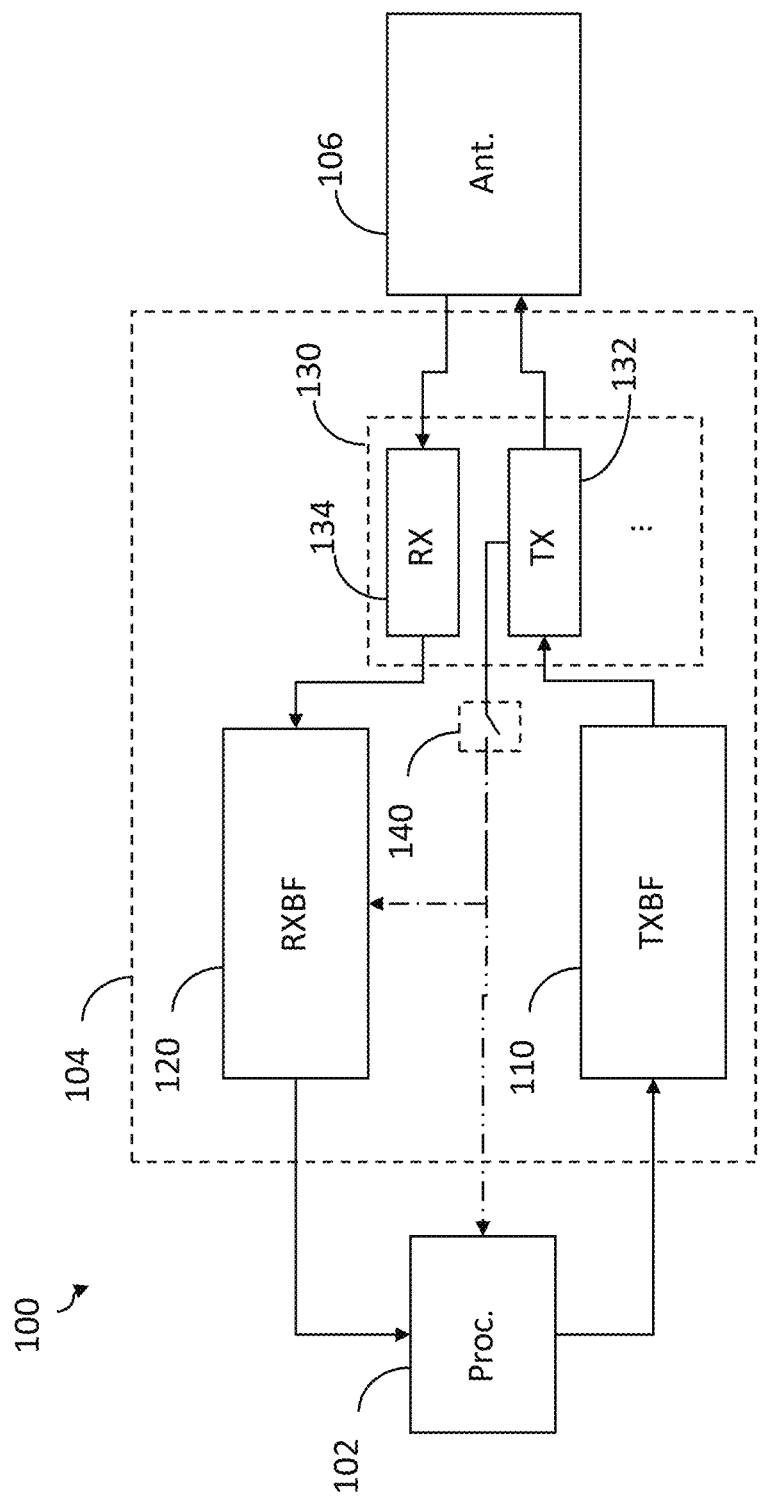
FIG. 1 is a block diagram of an example phased array system with a distortion measurement switch network, according to some embodiments.

The inventors have recognized several drawbacks of existing phased array systems that implement DPD. For instance, some existing phased array systems obtain transmitter non-linearity measurements using couplers associated with each transceiver, and the couplers are connected in series with one another throughout the transceiver array. In this manner, each transmitter may be individually activated and its measurement obtained through the series connection for baseband DPD processing. However, connecting all of the couplers for each transceiver in series to create a single static path through the transceiver array has adverse consequences for the quality of the non-linearity measurements. For instance, the electrical length of the single static path through the entire array may be very long, resulting in undesired attenuation and/or phase changes along the path. Such attenuation and/or phase changes can result in inaccurate non-linearity measurements, as the measured power may be attenuated and/or reflect a power level at an inappropriate phase of the transmitted signal. Moreover, these problems are exacerbated at or near millimeter-wave (mmW) frequencies (e.g., in a range from 10-300 GHz) as path lengths that may be electrically small at microwave frequencies become relatively electrically large and parasitic impedances (e.g., capacitances and inductances) become more relatively significant than at low frequencies.

To overcome these drawbacks, the inventors developed systems with switchable circuitry configured to selectively couple transmitter outputs to processing hardware, which may be used to selectively route subsets of distortion measurements for DPD processing. Such systems may have short measurement propagation paths with substantially uniform attenuation and/or phase across a transceiver array. In one example, measurement propagation paths may be no longer than a row or column of the array. In some embodiments, systems described herein may be suitable for implementation at transmit and/or receive frequencies in a range from 10 GHz to 300 GHz, though such systems may be implemented at other frequencies within the scope of the present aspects.

In some embodiments, a transceiver system may include a plurality of transceivers arranged in a plurality of groups of at least one transceiver. For example, each group of transceivers may correspond to a row or column of antennas in an associated antenna array. Each transceiver may include a transmit amplifier and a coupler coupled to an output of the transmit amplifier. For example, the transmit amplifier may be configured to transmit signals via an antenna array, and the coupler may be configured to obtain a portion of a signal output from the transmit amplifier as a non-linearity measurement. The transceiver system may further include a plurality of switches, each switch configured to be coupled between a processor and at least one coupler of a respective group of at least one transceiver of the plurality of groups of at least one transceiver. For example, each switch may be connected (e.g., by transmission line) to one or more of the couplers (e.g., to an individual coupler or to a whole group associated with a row or column) and may have a connection for communicating to the processor (e.g., when the processor is included in or otherwise connected to the transceiver system). In some embodiments, switches each configured to be coupled between a processor and at least one coupler of a respective group of at least one transceiver advantageously provide multiple electrically short, switchable propagation paths between the couplers and processor, as opposed to a single, static, electrically long propagation path, making such a system suitable for obtaining and providing non-linearity measurements to a processor for DPD processing.

In some embodiments, a transceiver system may include a plurality of transmitters configured to operate in at least one frequency band (e.g., within a range from 10-300 GHz). For example, each transmitter may include circuitry configured to obtain a distortion measurement of the transmitter, such as a capacitive, inductive, and/or directional coupler. The system may further include a switch network controllable to selectively couple at least one of the distortion measurements of the plurality of transmitters to a processor. For example, when the system includes or is otherwise connected to the processor, the switch network may be controlled between a plurality of states to select ones of the distortion measurements from the plurality of transmitters for providing to the processor for DPD processing. In some embodiments, a switch network controllable to selectively couple distortion measurements from a plurality of transmitters to a processor advantageously provides multiple electrically short, switchable measurement propagation paths, as opposed to a single, static electrically long measurement propagation path, making such a system suitable for use at or near mmW frequencies (e.g., in a range from 10 GHz to 300 GHz).

In some embodiments, aspects described herein may be flexible enough for implementation in a variety of transceiver systems. For example, switchable circuitry described herein may be configured to bypass beamforming circuitry of the transceiver system to provide distortion measurements to a processor for DPD processing, or may be coupled to the processor via the beamforming circuitry as is appropriate for the application. As another example, switchable circuitry described herein may be configured for selectively distortion measurements individual transceivers of a group (e.g., row or column) or for selectively coupling to a group of transceivers, as is appropriate for the application. As yet another example, switchable circuitry described herein may be used with transceiver systems having beamforming circuitry that operates in an intermediate frequency (IF) band and/or with transceivers systems having beamforming circuitry that operates in the transmit and/or receive frequency band at which signals are transmitted and/or received, as is appropriate for the application.

It should be appreciated that aspects described herein may be used alone or in combination.

FIG. 1 is a block diagram of an example phased array system 100 with a distortion measurement switch network, according to some embodiments. As shown in FIG. 1, phased array system 100 includes a processor 102, a transceiver system 104, and an antenna system 106. In some embodiments, processor 102 may be configured to provide signals to transceiver system 104 for transmission via antenna system 106 and to receive signals from antenna system 106 via transceiver system 104.

In some embodiments, phased array system 100 may be implemented in a communication device, such as a mobile device (e.g., mobile phone), a centralized base station (e.g., central cell tower), or a distributed network node (e.g., decentralized evolved Node B). For example, the communication device may be configured for transmission and/or reception of cellular signals according to a cellular standard such as a 5G communications standard, though other existing and future cellular standards may benefit from the technology disclosed herein.

In some embodiments, components of phased array system 100 may be implemented in a communications device using integrated circuit technology. For example, processor 102 may include one or more integrated circuits mounted on a circuit board and in communication with a central processing unit (CPU) of the communications device, though in some embodiments processor 102 may be (and/or may be part of) the CPU of the communications device. In some embodiments, transceiver system 104 may include one or more integrated circuits coupled to the integrated circuit(s) of processor 102. As one example, integrated circuits including processor 102 and transceiver system 104 may be formed on the same circuit board and interconnected using traces of the circuit board, though in other embodiments they may be formed on different circuit boards connected to one another by an electrical connector. In some embodiments, antenna system 106 may be coupled to transceiver system 104 by one or more cables (e.g., coaxial cables).

In some embodiments, processor 102 may be configured to control transmission and reception of signals using transceiver system 104 and antenna system 106. For example, processor 102 may be located within a first communications device (e.g., a mobile phone) and configured to generate baseband signals encoded with a message (e.g., a binary coded message), such as encoded with data to be transmitted by antenna system 106 to another communications device (e.g., a cellular base station and/or evolved Node B). In some embodiments, processor 102 may be configured as a baseband processor configured to operate in a frequency band lower than intermediate and transmit and/or receive frequencies of the system.

In some embodiments, processor 102 may be configured to modulate messages prior to transmission to encode the messages into signals for transmission, such as using a phase shift keyed (PS) encoding scheme. For example, processor 102 may be configured to use a Binary Phase Shift Keyed (BPSK) and/or Quadrature Phase Shift Keyed (QPSK) modulation scheme. In another example, processor 102 may be configured to use amplitude modulation (AM), such as Quadrature Amplitude Modulation (QAM).

In some embodiments, transceiver system 104 may be configured to steer and amplify signals from processor 102 for transmission by antenna system 106 and to amplify and steer signals from antenna system 106 for providing to processor 102. As shown in FIG. 1, transceiver system 104 includes transmit beamformer 110, receive beamformer 120, transceivers 130, and distortion measurement switch network 140.

In some embodiments, transmit beamformer 110 may be configured to steer signals from processor 102 in a particular direction using antenna system 106. For example, transmit beamformer 110 may include phase shift and/or time delay circuitry configured to introduce a phase shift and/or time delay into signals from processor 102 appropriate to steer the signals in a particular direction when fed to respective antennas of an antenna array within antenna system 106. In this example, by applying time delays and/or phase shifts to signals transmitted by respective antennas in a row and/or column of the antenna array, the signals may be steered in a particular direction with respect to the row and/or column. In some embodiments, transmit beamformer 110 may include one or more splitters configured to divide a signal from processor 102 into multiple signals (e.g., for antennas within a particular row and/or column of an antenna array) such that transmit beamformer 110 may apply an appropriate phase and/or time delay to each divided signal. In other embodiments, processor 102 may be configured to provide an appropriate number of signals to transmit beamformer 110 (e.g., for antennas within a particular row and/or column of an antenna array) for transmit beamformer to apply the appropriate phase and/or time delay to each signal.

In some embodiments, receive beamformer 120 may be configured to steer reception of signals using antenna system 106. For example, receive beamformer 120 may include phase shift and/or time delay circuitry configured to introduce a phase shift and/or time delay into signals from antenna system 106 appropriate to steer the signals from a particular direction prior to providing the signals to processor 102. In some embodiments, receive beamformer 120 may include one or more summing circuits configured to combine the phase shifted and/or time delayed signals (e.g., from antennas within a particular row and/or column of an antenna array) into fewer signals, such as a single signal. For example, processor 102 may be configured to process a single signal representative of the combined signals as though the single signal were received via a single antenna oriented to receive signals in the particular direction of receive beam focus.

In some embodiments, transceivers 130 may be configured to amplify signals from transmit beamformer 110 for transmission by antenna system 106, amplify signals received via antenna system 106 for providing to receive beamformer 120, and obtain distortion measurements for DPD processing. For example, as shown in FIG. 1, a transceiver 130 includes a transmitter 132 and a receiver 134. In some embodiments, transceiver system 104 may include a transceiver 130 for each antenna and/or group of antennas of antenna system 106. For example, each transmitter 132 may include a power amplifier configured to receive and amplify a respective signal from transmit beamformer 110 and provide the signal to a respective antenna and/or group of antennas of antenna system 106, and each receiver 134 may include a low noise amplifier configured to receive and amplify a signal from the respective antenna and/or group of antennas of antenna system 106. In some embodiments, transceivers 130 may further include a frequency mixer configured to up-convert signals from transmit beamformer 110 to a transmit frequency band (e.g., in a range from 10 GHz to 300 GHz) for transmission by antenna system 106 and/or a frequency mixer configured to down-convert signals from antenna system 106 to an IF band and/or baseband for beamforming by receive beamformer 120.

In some embodiments, transceivers 130 may be configured to provide distortion measurements of transmitters 132 for DPD processing. For example, each transceiver may further include a coupler coupled to an output of transmitter 132 to obtain a distortion measurement of transmitter 132. In some embodiments, transceivers 130 may further include impedance-controlled transmission lines coupled to the couplers for routing the distortion measurements to processor 102 for DPD processing.

In some embodiments, transceiver system 104 may be configured to select distortion measurements from transmitters 132 for providing to processor 102 for DPD processing. For example, as shown in FIG. 1, transceiver system 104 further includes distortion measurement switch network 140 coupled between transmitter 132 and processor 102. In some embodiments, distortion measurement switch network 140 may be configured to selectively couple a distortion measurement obtained from transmitter 132 to processor 102. For example, distortion measurement switch network 140 may be coupled to a coupler of transceiver 130 to obtain a distortion measurement from the coupler via an impedance-controlled transmission line. According to various embodiments, switches of switch network 140 may include transistors suitable for operation at the frequency band of signals and/or measurements the switches are configured to couple.

The inventors recognized that using a switch network to selectively couple transmitter distortion measurements to a processor permits multiple electrically short distortion measurement paths to be used rather than a single static and potentially electrically long measurement path. For example, in FIG. 1, distortion measurement switch network 140 may be controllable among a plurality of states, such as a first state in which switch network 140 couples a first transmitter 132 to processor 102 and a second state in which switch network 140 couples a second transmitter 132 to processor 102. In this example, controlling switch network 140 among the plurality of states permits the measurement path for each transmitter 132 (or for a group of transmitters 132) to be shorter than if a single, static path traversed every transmitter 132.

Figure 3:
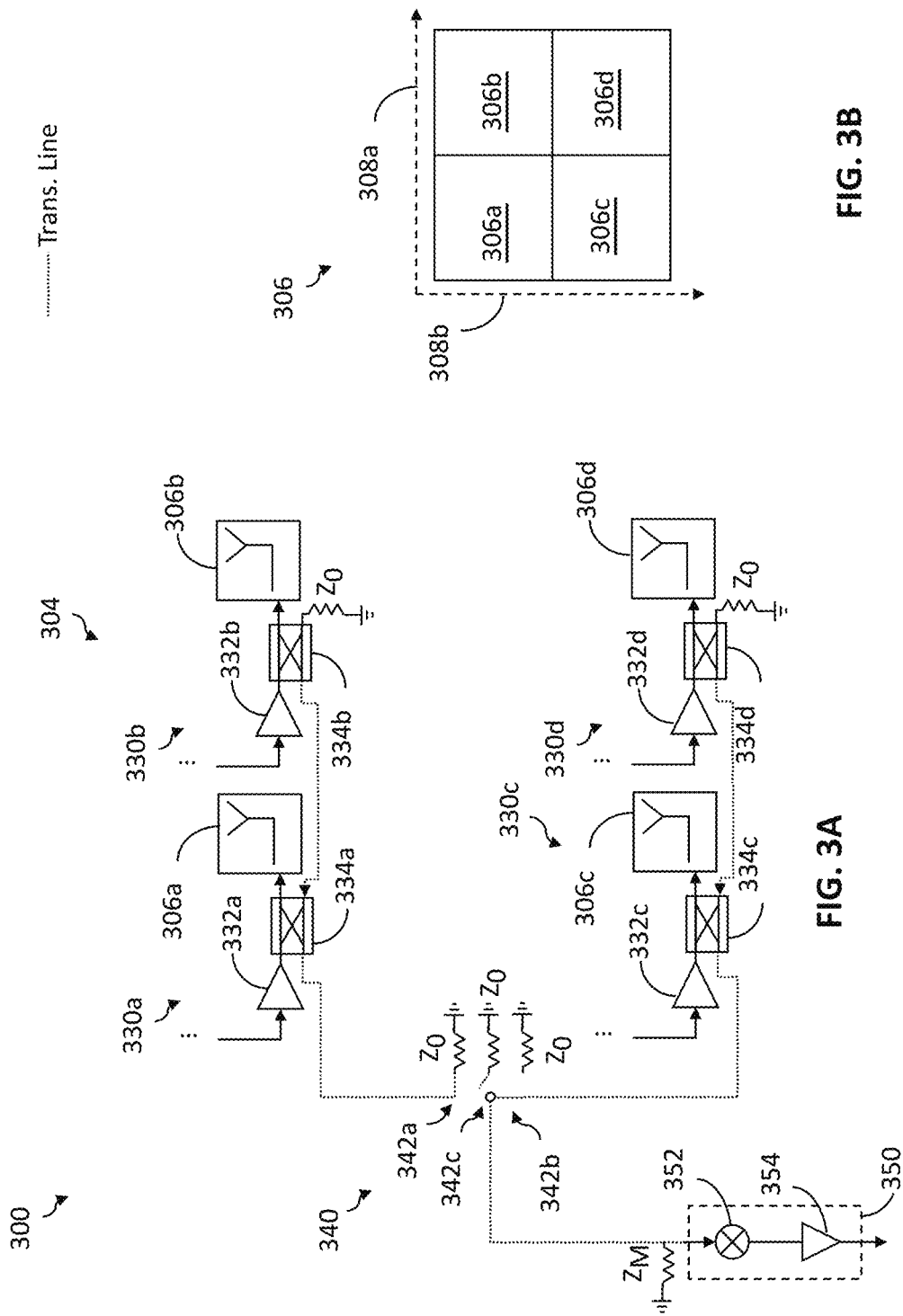
FIG. 3A is a circuit diagram of an example phased array system with a distortion measurement switch network interconnecting transceivers that correspond to multiple array dimensions and with dedicated measurement processing circuitry, according to some embodiments.
FIG. 3B is a diagram illustrating dimensions of the antenna array of FIG. 3A, according to some embodiments.

In some embodiments, distortion measurement switch network 140 may be configured to selectively provide distortion measurements to processor 102, bypassing receive beamformer 120. For example, as indicated in FIG. 1 by the dash-double-dot line, distortion measurement switch network 140 may be coupled to processor 102 directly, such as using dedicated measurement processing circuitry (e.g., demodulation, summing, and/or amplification circuitry) that is coupled between distortion measurement switch network 140 and processor 102. Examples in which a switch network is configured to bypass a receive beamformer are described herein in connection with FIGS. 3 and 6. The inventors recognized that, where dedicated measurement processing circuits are implemented between transceivers 130 and processor 102, distortion measurement switch network 140 may permit a small number of dedicated measurement processing circuits to be, such as one dedicated measurement processing circuit per row or column of the array, or even one dedicated measurement processing circuit for the entire array, which is advantageous for some applications. It should be appreciated that any number of dedicated measurement processing circuits may be used within the scope of the present aspects.

In some embodiments, distortion measurement switch network 140 may be configured to selectively provide distortion measurements to processor 102 via receive beamformer 120. For example, as indicated in FIG. 1 by the dash-single-dot line, distortion measurement switch network 140 may be coupled to beamforming circuitry of receive beamformer 120, such as demodulation and/or summing circuitry of receive beamformer 120 that is also configured for demodulating and/or summing signals received via antenna system 106 and receiver 134. Examples in which a switch network is configured to provide distortion measurements to a processor 102 via a receive beamformer are described herein in connection with FIGS. 4-5 and 7-8. The inventors recognized that providing distortion measurements to processor 102 via receive beamformer 120 may advantageously reuse the beamforming circuitry for routing distortion measurements to processor 102 for DPD processing, making dedicated distortion measurement circuitry unnecessary in some embodiments, which is advantageous for some applications.

In some embodiments, processor 102 may be configured to receive individual distortion measurements one transmitter at a time (or one group of transmitters at a time) and aggregate and use as representative of an average distortion measurement for applying DPD to signals prior to transmission. In other embodiments, dedicated measurement processing circuitry between switch network 140 and processor 102 may be configured to aggregate distortion measurements from transmitters (and/or groups of transmitters) for processor 102 to use as representative of an average distortion measurement. Yet, in other embodiments, receive beamformer 120 may be configured to receive and combine distortion measurements from switch network 140 into an aggregate distortion measurement for processor 102 to use as representative of an average distortion measurement. In some embodiments, processor 102 may be configured to perform DPD processing using the distortion measurements during a calibration stage, such as upon system startup and/or periodically during operation of phased array system 100.

In some embodiments, antenna system 106 may be configured to transmit signals from transceivers 130 and/or to receive and provide signals to transceivers 130. For example, antenna system 106 may include an array of antennas, such as with an antenna and/or group of antennas for each transceiver 130. In some embodiments, each transceiver 130 may be coupled to an antenna in an array having a first dimension (e.g., rows) and a second dimension (e.g., columns). In some embodiments, antennas may be grouped within one of the first and second dimensions (e.g., by row or column). For example, a transceiver 130 may be configured to provide signals to a row or column of antennas. Alternatively or additionally, transceivers 130 may be configured to provide signals to respective antennas within the same row or column of antennas.

In some embodiments, transceivers 130 may be grouped corresponding to a grouping of antennas to which the transceivers 130 correspond. For example, a group of transceivers 130 that correspond to a row of antennas in an antenna array may be considered as a row of transceivers 130, whereas a group of transceivers 130 that correspond to a column of antennas in the antenna array may be considered as a column of transceivers 130.

In some embodiments, processor 102 may be configured to control transmit beamformer 110 to steer transmitted signals a direction that tracks a direction of target device determined using signals received from the target device. For example, processor 102 may be configured to control the amount of time delay and/or phase shift applied by transmit beamformer 110 to result in steering signals in the determined direction of the target device. In this example, processor 102 may be configured to determine the direction of the target device based on power levels of signals received from the target device via antenna system 106, transceivers 130, and receive beamformer 120, when receive beamformer 120 is controlled to steer reception of antenna system 106 in one or more directions.

In some embodiments, components of phased array system 100, such as transceiver system 104 and/or antenna system 106, may be configured to transmit and/or receive signals within at least one frequency band located in a range between 10 GHz and 300 GHz. In some embodiments, components of phased array system 100 may be configured to transmit and/or receive signals in at least one frequency band within a range between 24 GHz and 71 GHz. For example, components (e.g., transmitters and/or receivers) of phased array system 100 may be configured to operate in one or more frequency bands associated with a 5G communications standard, such as from 24-29 GHz, 37-40 GHz, 40-43 GHz, and/or 47-48 GHz, though other frequency bands may be used.

While not shown in FIG. 1, in some embodiments transmit beamformer 110 may include a digital-to-analog converter (DAC) configured to obtain digital signals from processor 102 and generate analog signals for beamforming. In some embodiments, receive beamformer 120 may include an analog-to-digital converter (ADC) configured to digitize received signals and/or distortion measurements for providing to processor 102. According to various embodiments, DACs and/or ADCs may be operated at baseband and/or in an IF band, for example. In some embodiments, transceiver system 104 may include components within and/or coupled between receive beamformer 120 configured to reduce the power level of received signals and/or obtained measurements to be within the dynamic range of the ADC(s). For example, the amount of power reduction may depend on the number of transceivers from which signals are received and/or measurements are obtained.

Figure 2:
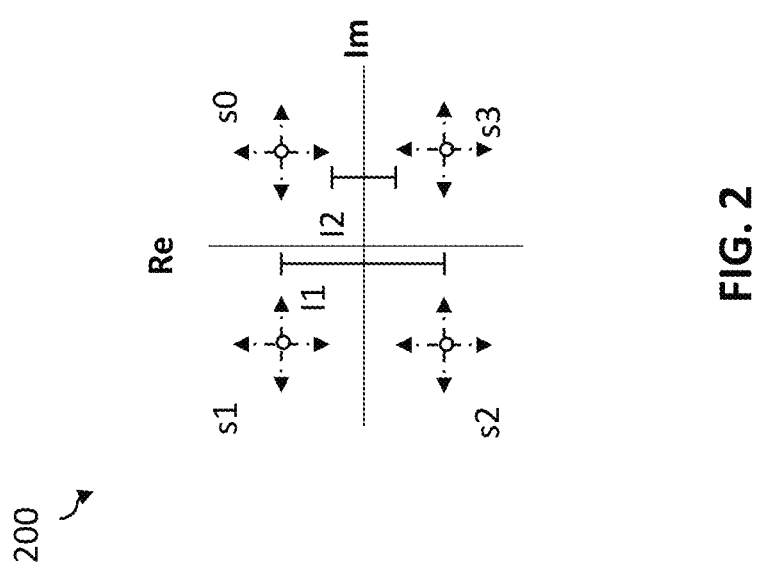
FIG. 2 is a graph of a Quadrature Phase Shift Keyed (QPSK) symbol constellation illustrating example effects of transmitter distortion, according to some embodiments.

FIG. 2 is a graph of a Quadrature Phase Shift Keyed (QPSK) symbol constellation 200 illustrating example effects of transmitter distortion, according to some embodiments. As shown in FIG. 2, constellation 200 includes four message symbols s0, s1, s2, and s3.

In some embodiments, message symbols s0-s3 may represent distinct series of data bits selected to convey data from one communications device to another. For instance, message symbol s0 may correspond to the binary number 00, message symbol s1 may correspond to the binary number 01, message symbol s2 may correspond to the binary number 10, and message symbol s3 may correspond to the binary number 11.

In some embodiments, message symbols s0-s3 may be prone to distortion during transmission, such as when a signal containing one of the message symbol s0-s3 is amplified by a transmitter where non-linearity affects the message symbols s0-s3 differently. For example, non-linearity may cause each message symbol s0-s3 to drift within the constellation as indicated by the dotted arrows around each message symbol s0-s3. For instance, amplitude distortion may cause drift in the distance between the message symbol and the origin (e.g., sum of squares of real and imaginary components), and/or phase distortion may cause drift in the rotational position of the message symbol about the origin (e.g., inverse tangent angle of the ratio between real and imaginary components). In this example, isolation between adjacent message symbols, such as isolation level I1 shown between message symbols s1 and s2, could be reduced as far as to isolation level I2, shown between message symbols s0 and s3. Consequently, it is more likely that message symbols will be mistaken for one another in the presence of distortion, leading to a bit or symbol error, than without distortion.

In some embodiments, DPD processing may be employed to mitigate the impact of transmitter non-linearity on signal distortion. For example, where a transmitter is measured to distort a message symbol (e.g., by changing its power level and/or phase), DPD processing may be applied to compensate for the measured distortion, resulting in message symbols having substantially the desired amount of signal power after amplification for transmission. In some embodiments, DPD processing may be employed to improve amplifier efficiency, such as by providing signals to the amplifier inputs with power levels that are close to a saturated power level as non-linearity caused by operating at or proximate the saturated power level may be mitigated by DPD processing.

In some embodiments, DPD processing may be implemented by driving one or more amplifiers with an input power sweep signal and/or a modulated signal (e.g., a quadrature amplitude modulated signal), obtaining one or more measurements of the amplifier output(s), and comparing the input signal to the measurement(s). For example, a transfer function may be determined to capture the relationship between the measurement(s) and the amplifier output(s), and the inverse of the transfer function may be applied to signals to be transmitted to compensate for measured distortion.

While a QPSK constellation is illustrated in FIG. 2 to show example effects of distortion due to non-linear transmitters, it should be appreciated that other message encoding schemes may be impacted similarly, and that distortion may occur in ways other than the illustrative example provided.

FIG. 3A is a circuit diagram of an example phased array system 300 with a distortion measurement switch network interconnecting transceivers corresponding to multiple array dimensions and with dedicated measurement processing circuitry, according to some embodiments. FIG. 3B is a diagram illustrating dimensions of the antenna array 306 of FIG. 3A, according to some embodiments.

In some embodiments, phased array system 300 may be configured in the manner described herein for phased array system 100. For example, as shown in FIG. 3A, phased array system 300 includes a transceiver system 304 and antenna system 306. Although not shown in FIG. 3A, it should be appreciated that phased array system 300 further includes a processor that may be configured in the manner described herein for processor 102.

In some embodiments, transceiver system 304 may be configured in the manner described herein for transceiver system 104. For example, as shown in FIG. 3A, transceiver system 304 includes transceivers 330*a*, 330*b*, 330*c*, and 330*d*, distortion measurement switch network 340, and distortion measurement processing circuitry 350.

In some embodiments, antenna system 306 may be configured in the manner described herein for antenna system 106. For example, as shown in FIG. 3A, antenna system 306 includes four antennas 306*a*, 306*b*, 306*c*, and 306*d*. As shown in FIG. 3A, each antenna 306*a*, 306*b*, 306*c*, and 306*d* is coupled to a respective transceiver 330*a*, 330*b*, 330*c*, and 330*d* of transceiver system 304. In some embodiments, antennas 306*a*, 306*b*, 306*c*, and 306*d* may be disposed in an array arranged in multiple dimensions. For example, as shown in FIG. 3B, antennas 306*a* and 306*b* are arranged in a first group disposed along a first dimension 308*a* and antennas 306*c* and 306*d* are arranged in a second group disposed along first dimension 308*a* (e.g., as rows disposed along a row dimension). Also shown in FIG. 3B, antennas 306*a* and 306*c* are arranged in a third group disposed along a second dimension 308*b* orthogonal to first dimension 308*a*, and antennas 306*b* and 306*d* are arranged in a fourth group disposed along second dimension 308*b* (e.g., as columns disposed along a column direction).

In some embodiments, transceivers of transceiver system 304 may be arranged in groups of at least one transceiver that correspond to dimensions of an antenna array of antenna system 306. For example, as shown in FIGS. 3A-3B, transceivers 330*a* and 330*b* may form a group of transceivers corresponding to a group of antennas 306*a* and 306*b* disposed along first dimension 308*a* because transceivers 330*a* and 330*b* are coupled to antennas 306*a* and 306*b*, respectively. Similarly, as shown in FIGS. 3A-3B, transceivers 330*c* and 330*d* may form a group of transceivers corresponding to a group of antennas 306*c* and 306*d* disposed along first dimension 308*a* because transceivers 330*c* and 330*d* are coupled to antennas 306*c* and 306*d*, respectively.

In some embodiments, transceivers 330*a*, 330*b*, 330*c*, and 330*d* may be configured in the manner described herein for transceiver 130. For example, as shown in FIG. 3A, each transceiver 330*a*, 330*b*, 330*c*, and 330*d* includes a transmitter with an amplifier 332*a*, 332*b*, 332*c*, and 332*d*, respectively. Also shown in FIG. 3A, each transceiver 330*a*, 330*b*, 330*c*, and 330*d* further includes a directional coupler 334*a*, 334*b*, 334*c*, and 334*d*, respectively. Although not shown in FIG. 3A, it should be appreciated that each transceiver 330*a*, 330*b*, 330*c*, and 330*d* further includes a receiver that may be configured in the manner described herein for receiver 134.

In some embodiments, directional couplers 334*a*, 334*b*, 334*c*, and 334*d* may be configured to obtain distortion measurements from respective amplifiers 332*a*, 332*b*, 332*c*, and 332*d*. For example, as shown in FIG. 3A, directional coupler 334*a* has an input port coupled to an output of amplifier 332*a*, an output port coupled to antenna 306*a*, and a coupled port coupled to distortion measurement switch network 340. In the illustrated embodiment, the input port is configured as an input of directional coupler 334*a* for receiving signals output from amplifier 332*a* and the output port and coupled port are configured as outputs of directional coupler 334*a* for providing the signals to antenna 306*a* and an attenuated measurement of the signals to switch network 340, respectively.

In some embodiments, directional couplers 334*a*, 334*b*, 334*c*, and 334*d* may be configured to obtain output power from amplifiers 332*a*, 332*b*, 332*c*, and 332*d* for distortion measurements, such that each distortion measurement is representative of the individual transceiver 330*a*, 330*b*, 330*c*, and 330*d*. For example, distortion measurements from each amplifier 332*a*, 332*b*, 332*c*, and 332*d* may have a reduction in power level, such as a reduction of 20-30 decibels (dB) with respect to signals output from the amplifiers 332*a*, 332*b*, 332*c*, and 332*d*. In some embodiments, an impedance-controlled transmission line may be coupled between directional couplers 334*a* and 334*b* and between directional couplers 334*c* and 334*d* and/or between directional coupler 334*a* and switch 342*a* and between directional coupler 334*c* and switch 342*b*. For example, as shown in FIG. 3A, impedance-controlled transmission lines are indicated by dotted lines. Also shown in FIG. 3A, impedance-controlled transmission lines couple the isolated ports of directional couplers 334a and 334c to the coupled ports of directional couplers 334b and 334d, respectively. According to various embodiments, an impedance-controlled transmission line may include a microstrip, stripline, and/or other suitable transmission line structure configured to provide an appropriate impedance for interacting with directional couplers 334a, 334b, 334c, and/or 334d, switch network 340, and/or distortion measurement processing circuitry 350.

In some embodiments, directional couplers 334a, 334b, 334c, and 334d may be configured to combine distortion measurements from multiple amplifiers 332a, 332b, 332c, and 332d. For example, where the coupled port of one directional coupler (e.g., 334b) is coupled to the isolated port of another directional coupler (e.g., 334a), measurements from multiple amplifiers (e.g., 332a and 332b) may be provided to a processor simultaneously. In other embodiments, a distortion measurement for each amplifier may be obtained individually.

In some embodiments, distortion measurement processing circuitry 350 may be configured to convert received distortion measurements to be suitable for DPD processing by a processor. For example, as shown in FIG. 3A, distortion measurement processing circuitry 350 includes demodulator 352 and amplifier 354. In some embodiments, demodulator 352 may be configured to down-convert distortion measurements from the transmit frequency band at which the measurements were output from amplifiers 332a, 332b, 332c, and 332d to a baseband used by the processor. Alternatively or additionally, demodulator 352 may be configured to down-convert the distortion measurements to an IF band for downstream processing prior to the measurements reaching the processor. In some embodiments, amplifier 354 may be configured to increase the power of the distortion measurements to account for attenuation in the measurement path(s). Alternatively, amplifier 354 may be configured as a buffer, such as with unity gain. Although not shown in FIG. 3A, in some embodiments, distortion measurement processing circuitry 350 may include an analog-to-digital converter (ADC) configured to digitize the measurements for providing to the processor.

In some embodiments, groups of transceivers may be disposed equidistantly from connections to distortion measurement processing circuitry 350. For example, an impedance-controlled transmission line coupling first switch 342a and directional coupler 334a may be the same electrical length as an impedance-controlled transmission line coupling second switch 342b and directional coupler 334c. In other embodiments, connections to distortion measurement processing circuitry 350 may be at different distances from groups of transceivers. For instance, the connection may closest to one end of a row or column and farthest from another row or column.

In some embodiments, distortion measurement switch network 340 may be controllable to selectively couple distortion measurements from transceivers 330a, 330b, 330c, and 330d to a processor via distortion measurement processing circuitry 350. For example, as shown in FIG. 3A, distortion measurement switch network 340 includes a first switch 342a controllable to couple to transceivers 330a and 330b and a second switch 342b controllable to couple to transceivers 330c and 330d. In the illustrated example, first switch 342a may be controlled to selectively couple transceivers 330a and 330b to distortion measurement processing circuitry 350 and second switch 342b may be controlled to selectively couple transceivers 330c and 330d to distortion measurement processing circuitry 350. Also shown in FIG. 3A, switch network 340 includes a third switch 342c coupled between first switch 342a and second switch 342b. In some embodiments, third switch 342c may be configured to couple distortion measurement processing circuitry 350 to a matched load, which may block at least some undesired noise (e.g., reflections) from leaking through first switch 342a and/or second switch 342b to the transceivers (e.g., when no transceiver is selected for distortion measurement). In other embodiments, third switch 342c may be omitted (e.g., where such noise is minimal and/or at a tolerable level for the system).

In some embodiments, distortion measurement switch network 340 may be configurable among a plurality of states that couple and decouple respective transceivers to and from distortion measurement processing circuitry 350. For example, in a first state that is illustrated in FIG. 3A, transceivers 330c and 330d are coupled to distortion measurement processing circuitry 350 via second switch 342b, and transceivers 330a and 330b are decoupled from distortion measurement processing circuitry 350 due to first switch 342a connecting the transceivers to a matched load. In a second state, transceivers 330a and 330b may be coupled to distortion measurement processing circuitry 350 via first switch 342a and transceivers 330c and 330d may be decoupled from distortion measurement processing circuitry 350 due to second switch 342b connecting the transceivers to a matched load.

In some embodiments, distortion measurement switch network 340 may be configured to interconnect transceivers corresponding to multiple dimensions of an antenna array. For example, as shown in FIG. 3A, first switch 342a is coupled to a group of transceivers 330a and 330b corresponding to a first group of antennas 306a and 306b disposed along first dimension 308a and second switch 342b is coupled to a group of transceivers 330c and 330d corresponding to a second group of antennas 306c and 306d disposed along first dimension 308a and offset from the first group in second dimension 308b.

In some embodiments, switches of switch network 340 may be configured to be coupled between a processor and at least one coupler of a respective group of at least one transceiver. For example, as shown in FIG. 3A, first switch 342a is coupled between distortion measurement processing circuitry 350 and directional couplers 334a and 334b such that, when distortion measurement processing circuitry 350 is coupled to a processor, first switch 342a is thereby coupled between the processor and directional couplers 334a and 334b. Similarly, as shown in FIG. 3A, second switch 342b is coupled between distortion measurement processing circuitry 350 and directional couplers 334c and 334d such that, when distortion measurement processing circuitry 350 is coupled to a processor, second switch 342b is thereby coupled between the processor and directional couplers 334c and 334d. In the illustrated example, each of switches 342a and 342b is configured to be coupled between a processor and at least one of directional couplers 334a, 334b, 334c, and 334d. In some embodiments, a transceiver system 304 may alternatively or additionally include one or more other switches not configured in this manner, such as third switch 342c.

While only four antennas are shown in the antenna array of FIG. 3B, it should be appreciated that any number of antennas may be included within the scope of the present aspects. Likewise, while only two dimensions of the antenna array are shown in FIG. 3B, it should be appreciated that any number of dimensions may be included in an antenna array within the scope of the present aspects.

Moreover, while directional couplers are shown in the example of FIG. 3A, it should be appreciated that capacitive and/or inductive couplers may be alternatively or additionally used. For example, capacitive coupling may be achieved by placing a conductor proximate the output of the amplifier to generate a suitable capacitance for coupling a portion of a signal from the amplifier output via the capacitance. As another example, inductive coupling may be achieved by placing one of two mutually coupled conductive coils at the output of the amplifier to generate suitable inductive coupling to obtain a portion of a signal from the amplifier output via the coils. The amount of inductance and/or capacitance used for coupling may depend on the amount of signal power to be obtained as a measurement as well as the frequency band(s) for which measurements are to be obtained.

Moreover, while an impedance-controlled transmission line is shown in the example of FIG. 3A, it should be appreciated that some embodiments may not include an impedance-controlled transmission line. For example, the distance from the coupler to the point of IF and/or baseband down-conversion (e.g., using a demodulator) may be short enough that resulting parasitic effects are tolerable for some applications. As another example, a measurement from a coupler may be converted to a current and the path traveled by the current may have low enough impedance that resulting parasitic effects are tolerable for some applications.

Figure 4:
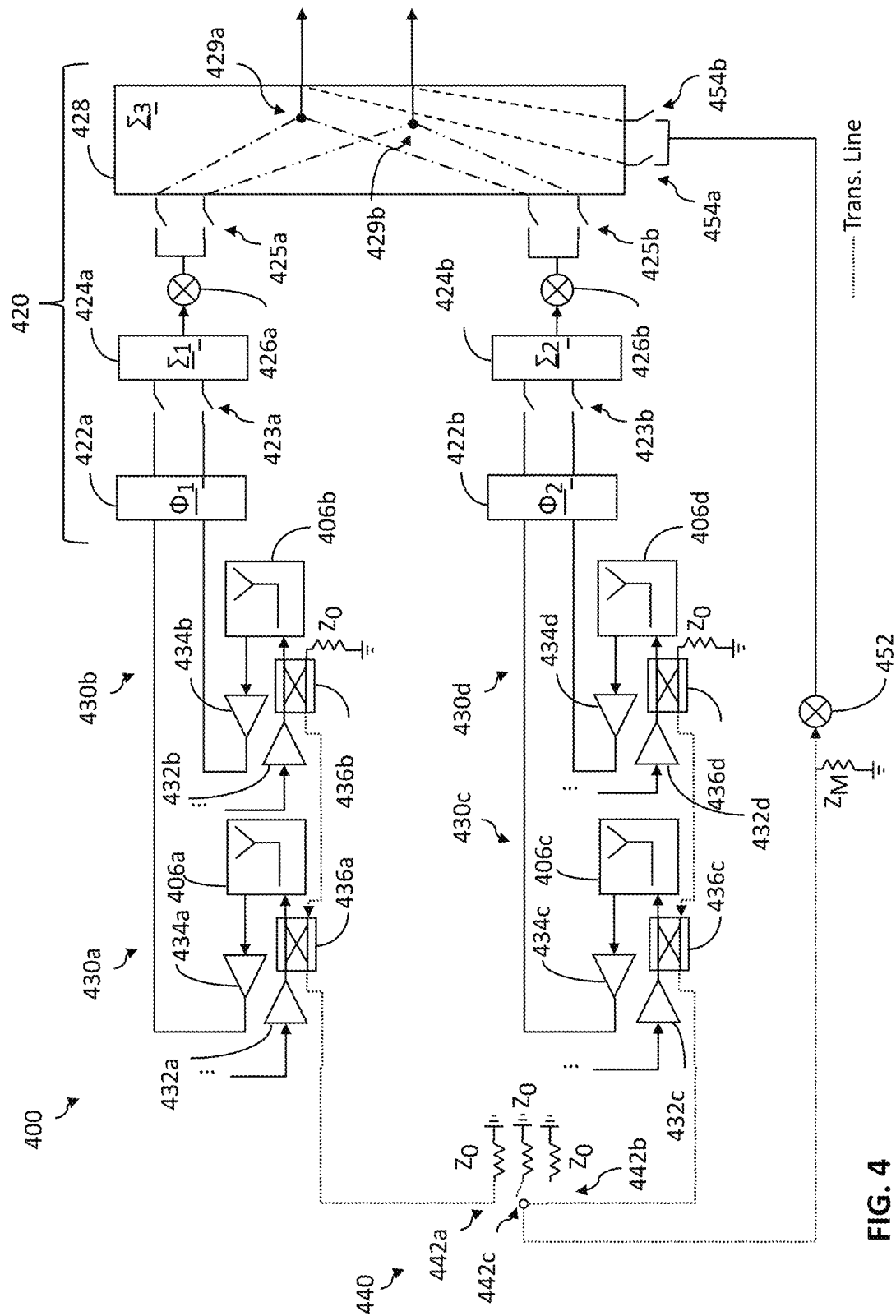
FIG. 4 is a circuit diagram of an example phased array system with a switch network as in FIG. 3A and dedicated measurement demodulation circuitry, according to some embodiments.

FIG. 4 is a circuit diagram of an example phased array system 400 with a switch network interconnecting transceivers corresponding to multiple array dimensions that is coupled to summing circuitry of the receive beamformer, according to some embodiments.

In some embodiments, phased array system 400 may be configured in the manner described herein for phased array system 300. For example, as shown in FIG. 4, phased array system 400 includes an antenna system with antennas 406a, 406b, 406c, and 406d. In some embodiments, antennas 406a, 406b, 406c, and 406d may be configured in the manner described herein for antennas 306a, 306b, 306c, and 306d. For example, antennas 406a, 406b, 406c, and 406d may be arranged in an array such as shown in FIG. 3B.

Also shown in FIG. 4, phased array system 400 includes a transceiver system with transceivers 430a, 430b, 430c, and 430d and distortion measurement switch network 440. In some embodiments, transceivers 430a, 430b, 430c, and 430d may be configured in the manner described herein for transceivers 330a, 330b, 330c, and 330d. For example, as shown in FIG. 4, each of transceivers 430a, 430b, 430c, and 430d is coupled to a respective antenna 406a, 406b, 406c, and 406d. Also shown in FIG. 4, each transceiver 430a, 430b, 430c, and 430d includes a transmitter including an amplifier 432a, 432b, 432c, and 432d, respectively, as well as a receiver including an amplifier 434a, 434b, 434c, and 434d, respectively. For example, amplifiers 432a, 432b, 432c, and 432d may be power amplifiers configured to transmit signals via antennas 406a, 406b, 406c, and 406d, respectively, and amplifiers 434a, 434b, 434c, and 434d may be low noise amplifiers configured to receive signals from antennas 406a, 406b, 406c, and 406d, respectively. Also shown in FIG. 4, each transceiver 430a, 430b, 430c, and 430d includes a directional coupler 436a, 436b, 436c, and 436d, which may be configured in the manner described herein for directional couplers 334a, 334b, 334c, and 334d, respectively.

In some embodiments, distortion measurement switch network 440 may be configured in the manner described herein for distortion measurement switch network 340. For example, as shown in FIG. 4, distortion measurement switch network 440 includes a first switch 442a coupled to directional couplers 436a and 436b of transceivers 430a and 430b, respectively, and a second switch 442b coupled to directional couplers 436c and 436d of transceivers 430c and 430d, respectively. Also shown in FIG. 4, switch network 440 includes a third switch 442c coupled between first switch 442a and second switch 442b, which may be configured in the manner described herein for third switch 342c.

In some embodiments, distortion measurement switch network 440 may be configured to couple distortion measurements from transceivers 430a, 430b, 430c, and 430d to a processor via beamforming circuitry of the transceiver system. For example, FIG. 4 further illustrates receive beamformer 420 of the transceiver system. In some embodiments, receive beamformer 420 may be configured to receive and combine signals from antennas 406a, 406b, 406c, and 406d to steer signal reception. For example, as shown in FIG. 4, receive beamformer 420 includes phase shifters 422a and 422b, first dimension summing circuits 424a and 424b, demodulators 426a and 426b, and second dimension summing circuit 428. In the illustrated embodiment, phase shifter 422a, first dimension summing circuit 424a, and demodulator 426a are coupled to the group of transceivers 430a and 430b and phase shifter 422b, first dimension summing circuit 424b, and demodulator 426b are coupled to the group of transceivers 430c and 430d.

In some embodiments, each phase shifter 422a and 422b may be configured to apply different phase shift amounts to signals received from respective transceivers within the group. For example, phase shifter 422a may be configured to apply different phase shift amounts to signals received from transceivers 430a and 430b, respectively. Alternatively or additionally, phase shifters 422a and 422b may be configured to apply different phase shift amounts to signals received from the respective groups of transceivers. For example, phase shifter 422a may be configured to apply a different phase shift amount to signals received from transceiver 430a than phase shifter 422b is configured to apply to signals received from transceiver 430c. In some embodiments, the amount of phase shift applied by each phase shifter 422a and 422b and/or to signals received from each transceiver 430a, 430b, 430c, and 430d may be set by a processor to achieve a desired beam steering direction. In some embodiments, first dimension summing circuits 424a and 424b may be configured to sum phase shifted signals received from phase shifters 422a and 422b.

In some embodiments, demodulators 426a and 426b may be configured to down-convert summed signals from first dimension summing circuits 424a and 424b to an intermediate frequency (IF) band between the transmit and/or receive frequency band and baseband. For instance, where the transmit frequency band is centered at 27 GHz, the IF band may be centered at 10 GHz, although other IF bands may be used depending on the signal bandwidth of the particular application. In some embodiments, second dimension summing circuit 428 may be configured to sum down-converted signals from demodulators 426a and 426b to output beamformed signals for processing.

In some embodiments, receive beamformer 420 may be configured to provide multiplexed signal outputs. For example, receive beamformer 420 may be configured to selectively output signals from one or more selected groups of transceivers 430a, 430b, 430c, and 430d. For example, as shown in FIG. 4, receive beamformer 420 includes first dimension switches 423a and 423b coupling phase shifters 422a and 422b to first dimension summing circuits 424a and 424b, respectively, and second dimension switches 425a and 425b coupling demodulators 426a and 426b to second dimension summing circuit 428, respectively. In some embodiments, first dimension switches 423a may be configured to selectively couple signals from a group of transceivers 430a and 430b (e.g., from a single transceiver of the group) to first dimension summing circuit 424a and first dimension switches 423b may be configured to selectively couple signals from a subset of transceivers 430c and 430d (e.g., a single transceiver) to first dimension summing circuit 424b.

In some embodiments, second dimension switches 425a may be configured to couple and decouple signals from the group of transceivers 430a and 430b to outputs of second dimension summing circuit 428 and second dimension switches 425b may be configured to couple and decouple signals from the group of transceivers 430c and 430d to outputs of second dimension summing circuit 428. For example, as shown in FIG. 4, second dimension summing circuit 428 includes a first summer 429a coupled to a switch of each of second dimension switches 425a and 425b (shown in dash-single-dot line) and a second summer 429b coupled to a switch of each of second dimension switches 425a and 425b (shown in dash-double-dot line). In the illustrated embodiment, each output of second dimension summing circuit 428 may output sums of different combinations of transceiver group outputs, depending on the states of second dimension switches 425a and 425b. Thus, in some embodiments, first dimension summing circuits 424a and 424b and second dimension summing circuit 428 may provide multiple selectable paths for transceiver outputs based on states of first dimension switches 423a and 423b and second dimension switches 425a and 425b.

In some embodiments, distortion measurement switch network 440 may be controllable to selectively couple distortion measurement from transceivers 430a, 430b, 430c, and 430d to receive beamformer 420. For example, as shown in FIG. 4, distortion measurement switch network 440 is further coupled to summing circuitry of receive beamformer 420. In the illustrated example, each of first switch 442a and second switch 442b is coupled to second dimension summing circuit 428 via a demodulator 452. In the illustrated example, each switch 442a and 442b is configured for coupling to a processor when second dimension summing circuit 428 is coupled to the processor. In some embodiments, demodulator 452 may be configured to down-convert distortion measurements to the IF band at which second dimension summing circuit 428 is configured to operate.

In some embodiments, second dimension summing circuit 428 may be configured to provide distortion measurements from distortion measurement switch network 440 to a processor. For example, second dimension summing circuit 428 may have dedicated, switchable paths for the distortion measurements (shown in dashed lines). In the illustrated embodiment, additional switches 454a and 454b are included to switchably couple distortion measurements to outputs of second dimension summing circuit 428. In some embodiments, the distortion measurements may bypass summers 429a and 429b of second dimension summing circuitry 428. For example, the down-converted distortion measurements may be provided to a processor in the manner that beamformed signals are. The inventors recognized that providing distortion measurements to a processor via receive beamformer 420 may advantageously use existing paths between receive beamformer 420 and the processor, making it unnecessary to provide dedicated connections between distortion measurement switch network 440 and the processor, as may be impractical in some applications.

While phase shifters 422a and 422b are shown in FIG. 4, it should be appreciated that some embodiments may alternatively or additionally implement time delay. Moreover, while phase shifters 422a and 422b are shown operating at the transmit and/or receive frequency band of the transceiver system, it should be appreciated that phase shift and/or time delay may be performed at an IF band. For example, demodulators 426a and 426b may be coupled to amplifiers 434a and 434b, and 434c and 434d, respectively, and phase shifters 422a and 422b may be downstream of demodulators 426a and 426b.

Figure 5:
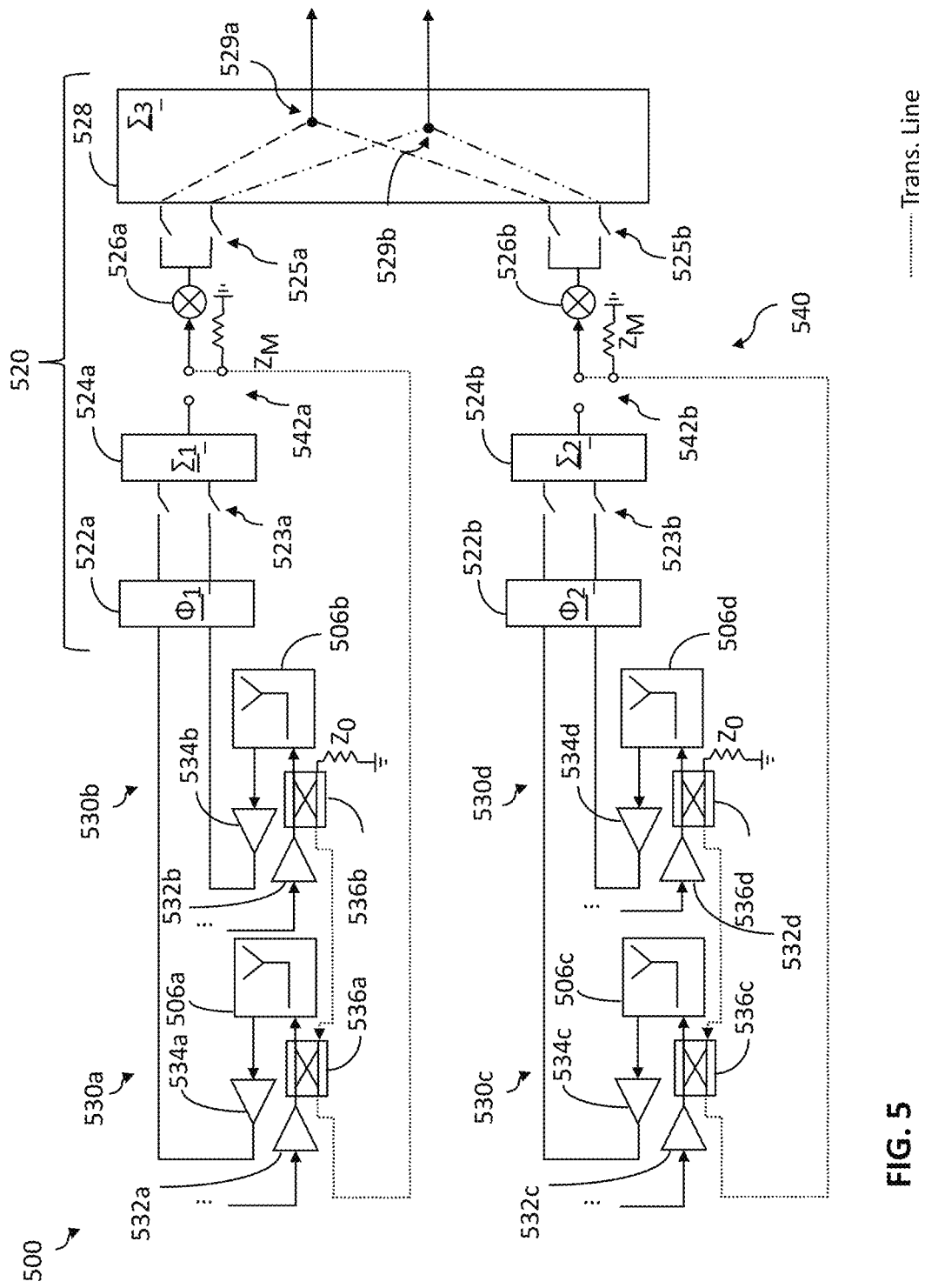
FIG. 5 is a circuit diagram of an example phased array system with a switch network as in FIG. 3A coupled to demodulation circuitry of the receive beamformer, according to some embodiments.

FIG. 5 is a circuit diagram of an example phased array system 500 with a switch network interconnecting transceivers corresponding to multiple array dimensions that is coupled to demodulation and summing circuitry of the receive beamformer, according to some embodiments.

In some embodiments, phased array system 500 may be configured in the manner described herein for phased array system 400. For example, as shown in FIG. 5, phased array system 500 includes an antenna system including antennas 506a, 506b, 506c, and 506d that may be configured in the manner described herein for antennas 406a, 406b, 406c, and 406d. Also shown in FIG. 5, phased array system 500 includes a transceiver system including transceivers 530a, 530b, 530c, and 530d, distortion measurement switch network 540, and receive beamformer 520.

In some embodiments, transceivers 530a, 530b, 530c, and 530d may be configured in the manner described herein for transceivers 430a, 430b, 430c, and 430d. For example, as shown in FIG. 5, each transceiver 530a, 530b, 530c, and 530d includes a transmitter including an amplifier 532a, 532b, 532c, and 532d, respectively, which may be configured in the manner described herein for amplifiers 432a, 432b, 432c, and 432d, respectively. Also shown in FIG. 5, each transceiver 530a, 530b, 530c, and 530d includes a receiver including an amplifier 534a, 534b, 534c, and 534d, respectively, which may be configured in the manner described herein for amplifiers 434a, 434b, 434c, and 434d, respectively. Also shown in FIG. 5, each transceiver 530a, 530b, 530c, and 530d includes a directional coupler 536a, 536b, 536c, and 536d, respectively, which may be configured in the manner described herein for directional couplers 436a, 436b, 436c, and 436d, respectively.

In some embodiments, receive beamformer 520 may be configured in the manner described herein for receive beamformer 420. For example, as shown in FIG. 5, receive beamformer 520 includes first dimension phase shifters 522a and 522b, first dimension switches 523a and 523b, first dimension summing circuits 524a and 524b, demodulators 526a and 526b, second dimension switches 525a and 525b, and second dimension summing circuit 528, which may be configured in the manner described herein for first dimension phase shifters 422a and 422b, first dimension switches 423a and 423b, first dimension summing circuits 424a and 424b, demodulators 426a and 426b, second dimension switches 425a and 425b, and second dimension summing circuit 428, respectively. For example, second dimension summing circuit 528 is shown including first summer 529a and second summer 529b, which may be configured in the manner described herein for first summer 429a and second summer 429b.

In some embodiments, distortion measurement switch network 540 may be configured in the manner described herein for distortion measurement switch network 440. For example, as shown in FIG. 5, distortion measurement switch network 540 includes first switch 542a and second switch 542b. In some embodiments, first switch 542a may be configured for coupling transceivers 530a and 530b to a processor and second switch 542b may be configured for coupling transceivers 530c and 530d to a processor. For example, as shown in FIG. 5, first switch 542a is coupled between receive beamformer 520 and transceivers 530a and 530b and second switch 542b is coupled between receive beamformer 520 and transceivers 530c and 530d. In the illustrated embodiment, when receive beamformer 520 is coupled to a processor, first switch 542a couples transceivers 530a and 530b to the processor via receive beamformer 520 and second switch 542b couples transceivers 530c and 530d to the processor via receive beamformer 520.

In some embodiments, distortion measurement switch network 540 may be coupled between demodulation circuitry of receive beamformer 520 and transceivers 530a, 530b, 530c, and 530d. For example, as shown in FIG. 5, first switch 542a is coupled between demodulator 526a and transceivers 530a and 530b and second switch 542b is coupled between demodulator 526b and transceivers 530c and 530d. In the illustrated embodiment, first and second switches 542a are configurable between a first state, in which first switch 542a couples first dimension summing circuit 524a to demodulator 526a and second switch 542b couples first dimension summing circuit 524b to demodulator 526b, and a second state in which first switch 542a couples distortion measurements from transceivers 530a and 530b to demodulator 526a and second switch 542b couples distortion measurements from transceivers 530c and 530d to demodulator 526b. In some embodiments, second dimension summing circuit 528 may be configured to provide demodulated distortion measurements from demodulators 526a and 526b to a processor. For example, demodulated distortion measurements received from one of transceivers 530a and 530b and from one of transceivers 530c and 530d may be summed using second dimension summing circuit 528, such as described herein for summing received signals using second dimension summing circuit 428. In the same or another example, the demodulated distortion measurements may be further down-converted to baseband for the processor.

The inventors recognized that coupling a distortion measurement switch network between demodulation circuitry of receive beamformer 520 and the transceivers may advantageously use the demodulation circuitry to additionally down-convert distortion measurements, making it unnecessary to include dedicated demodulation circuitry for distortion measurements, as may be impractical for some applications. Alternatively or additionally, where the receive beamformer has demodulation circuitry for each group of transceivers, such as shown in FIG. 5, distortion measurements may be obtained from a transceiver of each group simultaneously and summed using the receive beamformer. In this manner, distortion measurements may be obtained from each transceiver more quickly than if only one distortion measurement from one transceiver could be obtained at a time. It should be appreciated that distortion measurements may be obtained simultaneously from multiple transceivers while using dedicated demodulation circuitry in some applications, such as where phase differences between the simultaneous measurements are small enough for such applications.

It should be appreciated that, while phase shifters 522a and 522b are shown operating at the transmit and/or receive frequency band of the transceiver system, it should be appreciated that phase shift and/or time delay may be performed at an IF band. For example, demodulators 526a and 526b may be coupled to amplifiers 534a and 534b, and 534c and 534d, respectively, and also to distortion measurement switch network 540, and phase shifters 522a and 522b may be downstream of demodulators 526a and 526b.

Figure 6:
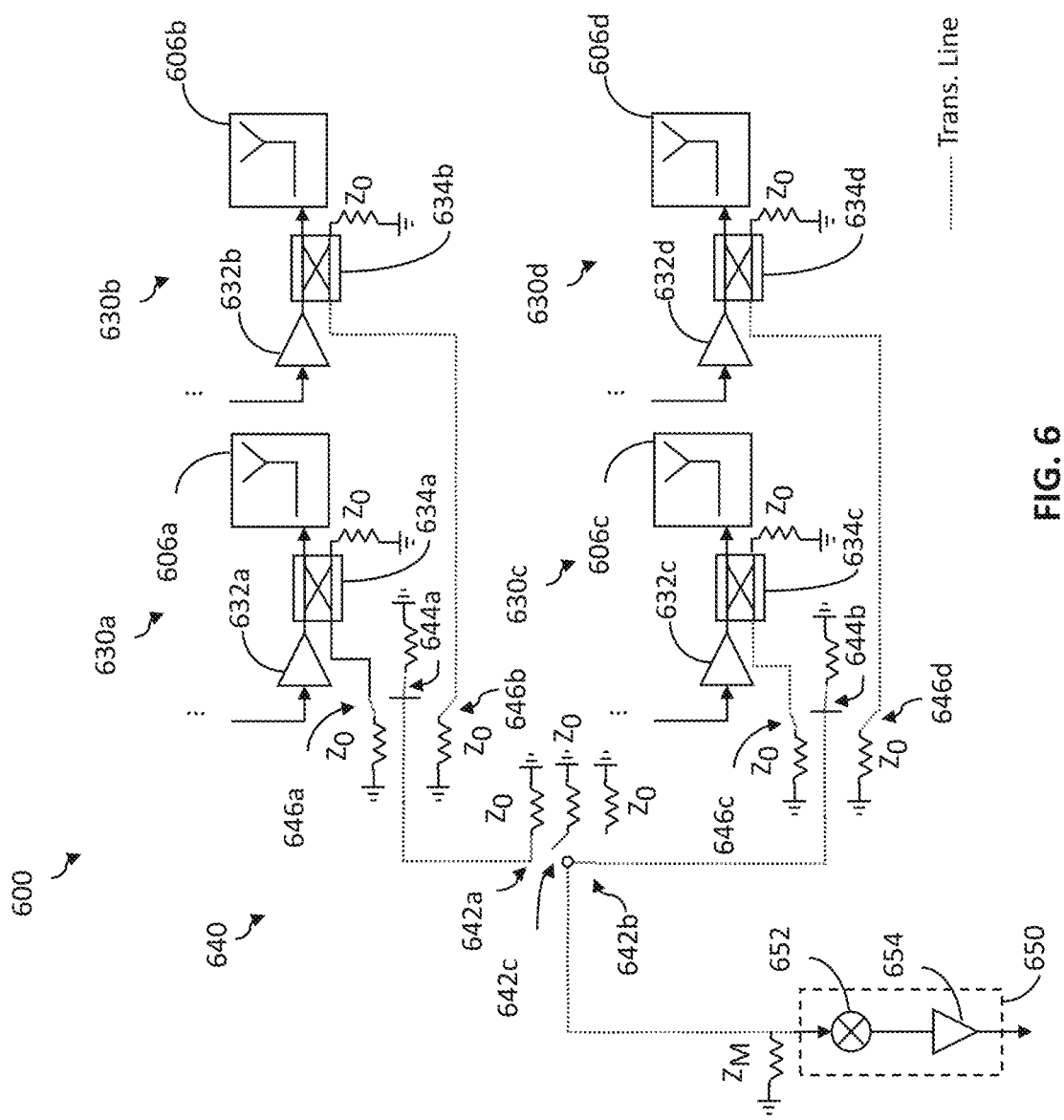
FIG. 6 is a circuit diagram of an example phased array system with a distortion measurement switch network interconnecting transceivers within the same corresponding array dimension and with dedicated measurement processing circuitry, according to some embodiments.

FIG. 6 is a circuit diagram of an example phased array system 600 with a distortion measurement switch network interconnecting transceivers within the same corresponding array dimension and with dedicated measurement processing circuitry, according to some embodiments.

In some embodiments, phased array system 600 may be configured in the manner described herein for phased array system 300. For example, as shown in FIG. 6, phased array system 600 includes an antenna system including antennas 606a, 606b, 606c, and 606d. Also shown in FIG. 6, phased array system 600 includes a transceiver system with transceivers 630a, 630b, 630c, and 630d, distortion measurement switch network 640, and distortion measurement processing circuit 650. In some embodiments, antennas 606a, 606b, 606c, and 606d may be configured in the manner described herein for antennas 306a, 306b, 306c, and 306d.

In some embodiments, transceivers 630a, 630b, 630c, and 630d may be configured in the manner described herein for transceivers 330a, 330b, 330c, and 330d. For example, as shown in FIG. 6, each transceiver 630a, 630b, 630c, and 630d includes a transmitter including an amplifier 632a, 632b, 632c, and 632d that may be configured in the manner described herein for amplifier 332a, 332b, 332c, and 332d, respectively. Also shown in FIG. 6, each transceiver 630a, 630b, 630c, and 630d includes a directional coupler 634a, 634b, 634c, and 634d that may be configured in the manner described herein for directional couplers 334a, 334b, 334c, and 334d, respectively.

In some embodiments, distortion measurement processing circuitry 650 may be configured in the manner described herein for distortion measurement processing circuitry 350. For example, as shown in FIG. 6, distortion measurement processing circuitry 650 includes demodulator 652 and amplifier 654, which may be configured in the manner described herein for demodulator 352 and amplifier 354, respectively.

In some embodiments, distortion measurement switch network 640 may be configured in the manner described herein for distortion measurement switch network 340. For example, as shown in FIG. 6, distortion measurement switch network 640 includes a first switch 642a coupled between distortion measurement processing circuitry 650 and transceivers 630a and 630b and a second switch 642b coupled between distortion measurement processing circuitry 650 and transceivers 630c and 630d. Also shown in FIG. 4, switch network 640 includes a third switch 642c coupled between first switch 642a and second switch 642b, which may be configured in the manner described herein for third switch 342c.

In some embodiments, distortion measurement switch network 640 may further have switches coupled between directional couplers within the same group of transceivers. For example, as shown in FIG. 6, distortion measurement switch network 640 further includes a fourth switch 646a, a fifth switch 646b, and a sixth switch 644a with fourth switch 646a coupled between first switch 642a and directional coupler 634a, fifth switch 646b coupled between first switch 642a and directional coupler 634b, and with sixth switch 644a coupled between first switch 642a and a matched load (e.g., as described herein for third switch 342c). In the illustrated embodiment, fourth switch 646a and fifth switch 646b are controllable to couple individual ones of transceivers 630a and 630b to distortion measurement processing circuitry 650 via first switch 642a. Similarly, as shown in FIG. 6, distortion measurement switch network 640 includes a seventh switch 646c coupled between second switch 642b and directional coupler 634c, an eighth switch 646d coupled between second switch 642b and directional coupler 634d, and a ninth switch 644b coupled between second switch 642b and a matched load (e.g., as described herein for third switch 342c). In the illustrated embodiment, fourth switch 646a is configured to be coupled between transceiver 630a and a processor, fifth switch 646b is configured to be coupled between transceiver 630b and a processor, seventh switch 646c is configured to be coupled between transceiver 630c and a processor, and eighth switch 646d is configured to be coupled between transceiver 630d and a processor.

The inventors recognized that distortion measurement switches coupled between couplers within the same group of transceivers permits a distortion measurement to be selectively obtained from individual transceivers while each transceiver transmits signals at the same time, which may be advantageous for applications in which it is impractical to only control one transceiver within a group of transceivers to transmit at any given time.

Figure 7:
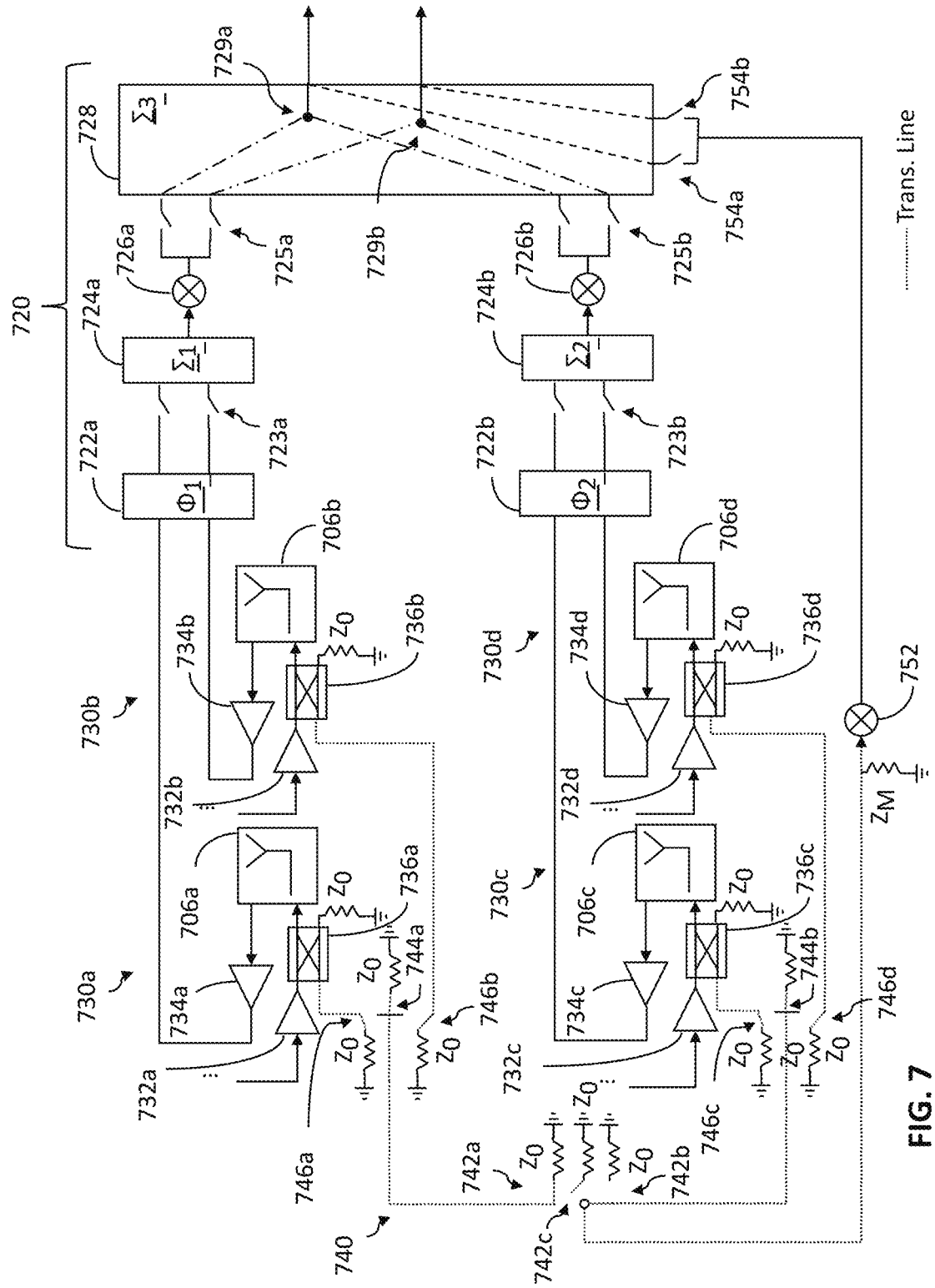
FIG. 7 is a circuit diagram of an example phased array system with a switch network as in FIG. 6 and dedicated measurement demodulation circuitry, according to some embodiments.

FIG. 7 is a circuit diagram of an example phased array system 700 with a distortion measurement switch network interconnecting transceivers within the same corresponding array dimension that is coupled to summing circuitry of the receive beamformer, according to some embodiments.

In some embodiments, phased array system 700 may be configured in the manner described herein for phased array system 400. For example, as shown in FIG. 7, phased array system 700 includes an antenna system with antennas 706a, 706b, 706c, and 706d and a transceiver system with transceivers 730a, 730b, 730c, and 730d, distortion measurement switch network 740, and receive beamformer 720. In some embodiments, antennas 706a, 706b, 706c, and 706d may be configured in the manner described herein for antennas 406a, 406b, 406c, and 406d, respectively.

In some embodiments, transceivers 730a, 730b, 730c, and 730d may be configured in the manner described herein for transceivers 430a, 430b, 430c, and 430d. For example, as shown in FIG. 7, each transceiver 730a, 730b, 730c, and 730d includes a transmitter including an amplifier 732a, 732b, 732c, and 732d, which may be configured in the manner described herein for amplifiers 432a, 432b, 432c, and 432d. Also shown in FIG. 7, each transceiver 730a, 730b, 730c, and 730d includes a receiver including an amplifier 734a, 734b, 734c, and 734d, which may be configured in the manner described herein for amplifiers 434a, 434b, 434c, and 434d. Also shown in FIG. 7, each transceiver 730a, 730b, 730c, and 730d includes a directional coupler 736a, 736b, 736c, and 736d, which may be configured in the manner described herein for directional couplers 436a, 436b, 436c, and 436d.

In some embodiments, receive beamformer 720 may be configured in the manner described herein for receive beamformer 420. For example, as shown in FIG. 7, receive beamformer 720 includes phase shifters 722a and 722b, first dimension switches 723a and 723b, first dimension summing circuits 724a and 724b, demodulators 726a and 726b, second dimension switches 725a and 725b, and second dimension summing circuit 728, which may be configured in the manner described herein for phase shifters 422a and 422b, first dimension switches 423a and 423b, first dimension summing circuits 424a and 424b, demodulators 426a and 426b, second dimension switches 425a and 425b, and second dimension summing circuit 428. In the illustrated embodiment, second dimension summing circuit 728 includes first summer 729a and second summer 729b, which may be configured in the manner described herein for first summer 429a and 429b, respectively. Also shown in FIG. 7 are additional switches 754a and 754b, which may be configured in the manner described herein for switches 454a and 454b, respectively.

In some embodiments, distortion measurement switch network 740 may be configured in the manner described herein for distortion measurement switch network 440. For example, as shown in FIG. 7, distortion measurement switch network 740 includes a first switch 742a coupled between second dimension summing circuit 728 of receive beamformer 720 and transceivers 730a and 730b via a demodulator 752 and a second switch 742b coupled between second dimension summing circuit 728 of receive beamformer 720 and transceivers 730c and 730d via demodulator 752. Also shown in FIG. 7, switch network 740 includes third switch 742c, which may be configured in the manner described herein for third switch 442c. In some embodiments, demodulator 752 may be configured in the manner described herein for demodulator 452.

In some embodiments, distortion measurement switch network 740 may be further configured in the manner described herein for distortion measurement switch network 640. For example, as shown in FIG. 7, distortion measurement switch network 740 further includes a fourth switch 746a coupled between first switch 742a and transceiver 730a, a fifth switch 746b coupled between first switch 742a and transceiver 730b, a sixth switch 744a coupled between first switch 742a and a matched load, a seventh switch 746c coupled between second switch 742b and transceiver 730c, an eighth switch 746d coupled between second switch 742b and transceiver 730d, and a ninth switch 744b coupled between second switch 742b and a matched load.

Figure 8:
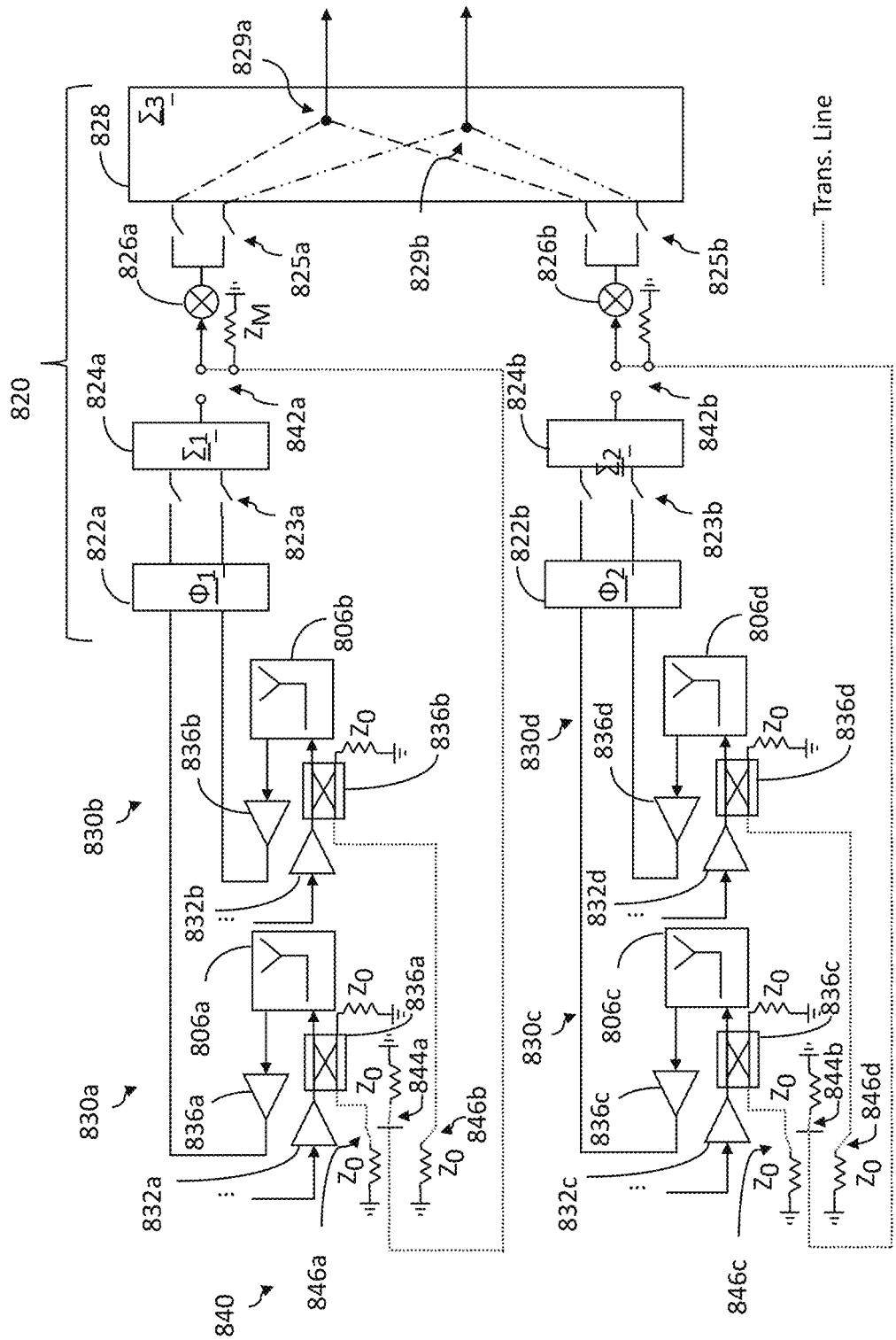
FIG. 8 is a circuit diagram of an example phased array system with a switch network as in FIG. 6 coupled to demodulation circuitry of the receive beamformer, according to some embodiments.

FIG. 8 is a circuit diagram of an example phased array system 800 with a distortion measurement switch network interconnecting transceivers within the same corresponding array dimension that is coupled to demodulation and summing circuitry of the receive beamformer, according to some embodiments.

In some embodiments, phased array system 800 may be configured in the manner described herein for phased array system 800. For example, as shown in FIG. 8, phased array system 800 includes an antenna system with antennas 806a, 806b, 806c, and 806d and a transceiver system with transceivers 830a, 830b, 830c, and 830d, distortion measurement switch network 840, and receive beamformer 820. In some embodiments, antennas 806a, 806b, 806c, and 806d may be configured in the manner described herein for antennas 506a, 506b, 506c, and 506d, respectively.

In some embodiments, transceivers 830a, 830b, 830c, and 830d may be configured in the manner described herein for transceivers 530a, 530b, 530c, and 530d. For example, as shown in FIG. 8, each transceiver 830a, 830b, 830c, and 830d includes a transmitter including an amplifier 832a, 832b, 832c, and 832d, which may be configured in the manner described herein for amplifiers 532a, 532b, 532c, and 532d. Also shown in FIG. 8, each transceiver 830a, 830b, 830c, and 830d includes a receiver including an amplifier 834a, 834b, 834c, and 834d, which may be configured in the manner described herein for amplifiers 534a, 534b, 534c, and 534d. Also shown in FIG. 8, each transceiver 830a, 830b, 830c, and 830d includes a directional coupler 836a, 836b, 836c, and 836d, which may be configured in the manner described herein for directional couplers 536a, 536b, 536c, and 536d.

In some embodiments, receive beamformer 820 may be configured in the manner described herein for receive beamformer 520. For example, as shown in FIG. 8, receive beamformer 820 includes phase shifters 822a and 822b, first dimension switches 823a and 823b, first dimension summing circuits 824a and 824b, demodulators 826a and 826b, second dimension switches 825a and 825b, and second dimension summing circuit 828, which may be configured in the manner described herein for phase shifters 522a and 522b, first dimension switches 523a and 523b, first dimension summing circuits 524a and 524b, demodulators 526a and 526b, second dimension switches 525a and 525b, and second dimension summing circuit 528. In the illustrated embodiment, second dimension summing circuit 828 includes first summer 829a and second summer 829b, which may be configured in the manner described herein for first summer 529a and second summer 529b, respectively.

In some embodiments, distortion measurement switch network 840 may be configured in the manner described herein for distortion measurement switch network 540. For example, as shown in FIG. 8, distortion measurement switch network 840 includes a first switch 842a coupled between demodulator 826a of receive beamformer 820 and transceivers 830a and 830b, and a second switch 842b coupled between demodulator 826b of receive beamformer 820 and transceivers 830c and 830d. In some embodiments, first switch 842a and second switch 842b may be configured in the manner described herein for first switch 542a and second switch 542b, respectively.

In some embodiments, distortion measurement switch network 840 may be further configured in the manner described herein for distortion measurement switch network 640. For example, as shown in FIG. 8, distortion measurement switch network 840 further includes a third switch 846a coupled between first switch 842a and transceiver 830a, a fourth switch 846b coupled between first switch 842a and transceiver 830b, a fifth switch 844a coupled between first switch 842a and a matched load, a sixth switch 846c coupled between second switch 842b and transceiver 830c, a seventh switch 846d coupled between second switch 842b and transceiver 830d, and an eighth switch 844b coupled between second switch 842b and a matched load. The inventors have recognized that switches coupled between couplers of transceivers within the same group and a demodulator for distortion measurements and/or signals from that group, such as shown in FIG. 8, advantageously may permit distortion measurements to be obtained simulatively from transceivers of multiple groups and combined using the same receive beamformer components used to combine received signals.

Having described several example systems herein, it should be appreciated that other implementations than those shown by way of example are contemplated within the scope of the present aspects.

As one example, while analog circuit implementations have been described herein for beamforming circuitry and phase shift or time delay circuitry, it should be appreciated that digital beamforming, phase shift, and/or time delay circuitry may be included in some implementations where appropriate.

As another example, while the first and second dimensions of an antenna system are described herein as rows and columns, it should be appreciated that other array dimensions may be used for beamforming within the scope of the present aspects. It should also be appreciated that, while a rectangular antenna array may include rows and columns, rows and columns may be alternatively or additionally included in irregular rectangular antenna arrays (e.g., missing some elements, rows, and/or columns) and/or non-rectangular antenna arrays (e.g., with rows and/or columns offset from adjacent rows and/or columns) within the scope of the present aspects. Moreover, while only two dimensions are shown in the examples of FIGS. 3-8, it should be appreciated that more than two dimensions may be implemented within the scope of the present aspects.

As another example, according to various embodiments, antenna systems described herein or usable with examples described herein may include various types of antennas, such as dipole antennas, monopole antennas, patch antennas, slot antennas, horn antennas, and/or any other suitable antennas. In some embodiments, antennas of an antenna system may include more than one antenna element. For example, an antenna may include multiple antenna elements configured with respective polarities that are orthogonal to one another. In this example, a transceiver as described herein may be configured to operate each of the polarities of the antenna element, and/or multiple transceivers as described herein may be coupled to the antenna to operate the respective polarities. Alternatively or additionally, an antenna may include multiple radiating elements with respective feeds, and a single transceiver or multiple transceivers as described herein may be coupled to the feeds of the antenna for using the respective radiating elements.

As yet another example, while transceivers described herein may be configured to operate in frequency bands in a range from 10 GHz to 300 GHz, it is also contemplated that techniques described herein would be useful in transceivers operating at lower or higher frequencies. For instance, such techniques may be suitable for use with sub-millimeter wave beamforming transceivers developed in the future.

In some embodiments, aspects described herein may embodied in a device, such as a communications device including a system described herein, and/or a device within a system described herein. In some embodiments, aspects described herein may be embodied in a method, such as a method of operating a system described herein and/or a method performed using a system described herein.

Various aspects of the systems described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components. Elements that are not "coupled" or "connected" are "decoupled" or "disconnected."

The terms "approximately", "substantially," and "about" may be used to mean within ±20% of a target value in some embodiments, within ±10% of a target value in some embodiments, within ±5% of a target value in some embodiments, and within ±2% of a target value in some embodiments. The terms "approximately" and "about" may include the target value.

What is claimed is:

1. A transceiver system, comprising:
a plurality of transmitters configured to operate in at least one frequency band in a range from 10 GHz to 300 GHz, each transmitter comprising circuitry configured to obtain a distortion measurement of the transmitter; and
a switch network controllable to selectively couple at least one of the distortion measurements of the plurality of transmitters to a processor;
wherein the switch network is controllable between, at least:
a first state, in which the switch network is configured to couple the circuitry of a first transmitter of the plurality of transmitters to the processor and to decouple the circuitry of a second transmitter of the plurality of transmitters from the processor; and
a second state, in which the switch network is configured to couple the circuitry of the second transmitter to the processor and to decouple the circuitry of the first transmitter from the processor;
wherein:
in the first state, the switch network is further configured to couple a first group of transmitters of the plurality of transmitters, including the first transmitter and a third transmitter, to the processor and to decouple a second group of transmitters of the plurality of transmitters, including the second transmitter and a fourth transmitter, from the processor; and
in the second state, the switch network is further configured to couple the second group of transmitters to a receive beamformer and to decouple the first group of transmitters from the processor.

2. The transceiver system of claim 1, wherein the plurality of transmitters are configured to operate in at least one frequency band within a range from 24 GHz to 71 GHz.

3. The transceiver system of claim 1, further comprising:
the processor, wherein the processor is a baseband processor configured to use the at least one of the distortion measurements to perform digital pre-distortion (DPD) processing on signals to be transmitted via the plurality of transmitters,
wherein the switch network is coupled to the processor.

4. The transceiver system of claim 1, wherein the circuitry of each of the plurality of transmitters comprises a directional coupler having an input coupled to an output of the transmitter and an output coupled to the switch network.

5. The transceiver system of claim 1, wherein each transmitter of the plurality of transmitters comprises an amplifier and the circuitry is configured to obtain the distortion measurement from an output of the amplifier.

6. A phased array system, comprising:
the transceiver system of claim 1; and
a plurality of antennas coupled to the plurality of transmitters, respectively, and configured to transmit and/or receive signals in the at least one frequency band.

7. The phased array system of claim 6, further comprising:
a receive beamformer comprising a summing circuit and a demodulator configured to receive signals via the plurality of antennas,
wherein the switch network is configured to provide distortion measurements of the plurality of transmitters to the processor via the summing circuit and/or the demodulator.

8. A transceiver system, comprising:
a plurality of transceivers arranged in a plurality of groups of at least one transceiver, each transceiver comprising a transmit amplifier and a coupler coupled to an output of the transmit amplifier;
a plurality of switches, each switch configured to be coupled between a processor and at least one coupler of a respective group of at least one transceiver of the plurality of groups of at least one transceiver;
a plurality of antennas coupled to the plurality of transceivers and configured to transmit and/or receive signals; and
receive beamforming circuitry comprising summing circuitry configured to sum signals received via the plurality of antennas and demodulation circuitry configured to down-convert a frequency of signals received via the plurality of antennas, the plurality of switches coupled between the summing circuitry and the respective couplers and/or between the demodulation circuitry and the respective couplers.

9. The transceiver system of claim 8, wherein:
the couplers are configured to obtain distortion measurements from the outputs of the transmit amplifiers, respectively; and
the plurality of switches are configured to provide the distortion measurements to the processor.

10. The transceiver system of claim 9, further comprising:
the processor, wherein the processor is a baseband processor configured to use the distortion measurements to perform digital pre-distortion (DPD) processing on signals to be transmitted via the plurality of transceivers,
wherein each switch is coupled between the processor and the at least one coupler of the respective group of at least one transceiver of the plurality of groups of at least one transceiver.

11. The transceiver system of claim 8, wherein the plurality of switches comprises:
a first switch configured to be coupled between the processor and a first coupler of a first group of at least one transceiver of the plurality of groups of at least one transceiver; and
a second switch configured to be coupled between the processor and a second coupler of a second group of at least one transceiver of the plurality of groups of at least one transceiver.

12. The transceiver system of claim 8, wherein the couplers are directional couplers, each directional coupler having an input coupled to an output of a respective transmit amplifier of the plurality of transceivers and an output coupled to the plurality of switches.

13. The transceiver system of claim 8, wherein the plurality of transceivers are configured to operate in at least one frequency band within a range from 24 GHz to 71 GHz.

14. A phased array system, comprising:
a transceiver system, comprising:
a plurality of transceivers arranged in a plurality of groups of at least one transceiver, each transceiver comprising a transmit amplifier and a coupler coupled to an output of the transmit amplifier; and a plurality of switches, each switch configured to be coupled between a processor and at least one coupler of a respective group of at least one transceiver of the plurality of groups of at least one transceiver; wherein the plurality of switches comprises a first switch and a second switch; the first switch is configured to be coupled between the processor and a first coupler of a first group of at least one transceiver of the plurality of groups of at least one transceiver, and the second switch configured to be coupled between the processor and a second coupler of a second group of at least one transceiver of the plurality of groups of at least one transceiver;

an antenna array arranged in a first dimension and a second dimension, the antenna array comprising:

a first group of antennas disposed along the first dimension; and a second group of antennas disposed along the first dimension and spaced from the first group of antennas in the second dimension, wherein:

the first group of at least one transceiver comprises a first plurality of transceivers respectively coupled to the first group of antennas; and the second group of at least one transceiver comprises a second plurality of transceivers respectively coupled to the second group of antennas.

15. The phased array system of claim 14, wherein:

the first switch is configured to be coupled between each coupler of the first plurality of transceivers and the processor; and the second switch is configured to be coupled between each coupler of the second plurality of transceivers and the processor.

16. The phased array system of claim 15, wherein the plurality of switches comprises a third switch coupled between the first switch and the second switch.

* * * * *